United States Patent
Kim

(10) Patent No.: US 10,236,224 B2
(45) Date of Patent: Mar. 19, 2019

(54) APPARATUS AND METHOD FOR REDUCING WAFER WARPAGE

(71) Applicant: SAMSUNG ELECTRONICS CO., LTD., Suwon-si, Gyeonggi-Do (KR)

(72) Inventor: Chang Ho Kim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/467,342

(22) Filed: Mar. 23, 2017

(65) Prior Publication Data

US 2018/0076098 A1    Mar. 15, 2018

(30) Foreign Application Priority Data

Sep. 13, 2016    (KR) .................. 10-2016-0117729

(51) Int. Cl.
| | | |
|---|---|---|
| *H01L 21/84* | (2006.01) | |
| *H01L 21/66* | (2006.01) | |
| *H01L 21/324* | (2006.01) | |
| *H01L 21/67* | (2006.01) | |

(52) U.S. Cl.
CPC ............ *H01L 22/20* (2013.01); *H01L 21/324* (2013.01); *H01L 21/67115* (2013.01); *H01L 21/67259* (2013.01); *H01L 21/67288* (2013.01)

(58) Field of Classification Search
None
See application file for complete search history.

(56) References Cited

U.S. PATENT DOCUMENTS

| | | | | |
|---|---|---|---|---|
| 5,155,336 A | * | 10/1992 | Gronet .................. | C23C 16/481 219/390 |
| 5,268,989 A | * | 12/1993 | Moslehi ............ | H01L 21/67115 118/725 |
| 5,382,551 A | * | 1/1995 | Thakur .................. | H01L 21/306 257/E21.214 |
| 5,444,815 A | * | 8/1995 | Lee ........................ | G01J 5/0003 118/724 |
| 5,851,929 A | * | 12/1998 | Thakur ............. | H01L 21/67115 438/795 |
| 5,926,742 A | * | 7/1999 | Thakur ............. | H01L 21/67288 438/795 |
| 6,605,955 B1 | | 8/2003 | Costello et al. | |
| 8,268,733 B2 | | 9/2012 | Tan et al. | |
| 8,288,208 B1 | | 10/2012 | Liu et al. | |
| 8,748,780 B2 | | 6/2014 | Moro et al. | |
| 8,889,441 B2 | | 11/2014 | Takai et al. | |
| 8,975,092 B2 | | 3/2015 | Uchibori et al. | |
| 9,093,337 B2 | | 7/2015 | Hwang et al. | |

(Continued)

*Primary Examiner* — David E Graybill
(74) *Attorney, Agent, or Firm* — F. Chau & Associates, LLC

(57) ABSTRACT

An apparatus and a method for reducing wafer warpage are provided. The method includes positioning a mold wafer structure on a stage. The mold wafer structure includes a mold layer and a stack structure positioned on a wafer. The stage includes a center region and an edge region adjacent the center region. Warpage information of the mold wafer structure is obtained. The mold wafer structure is heated by the stage based on the warpage information to reduce a warpage of the mold wafer structure. A temperature of the center region and a temperature of the edge region are different from each other. An operation test is performed on the stack structure.

20 Claims, 14 Drawing Sheets

(56) References Cited

U.S. PATENT DOCUMENTS

| | | | |
|---|---|---|---|
| 9,673,061 B2* | 6/2017 | Huang | H01L 21/324 |
| 2008/0017627 A1* | 1/2008 | Iwata | H01L 21/67109 |
| | | | 219/260 |
| 2008/0171131 A1* | 7/2008 | Moro | C23C 14/541 |
| | | | 427/8 |
| 2010/0190294 A1 | 7/2010 | Simmons-Matthews | |
| 2011/0034040 A1* | 2/2011 | Tan | F27B 17/0025 |
| | | | 438/795 |
| 2011/0052159 A1* | 3/2011 | Su | H01L 21/67115 |
| | | | 392/411 |
| 2012/0171875 A1* | 7/2012 | Gan | H01L 21/67288 |
| | | | 438/795 |
| 2013/0029438 A1* | 1/2013 | Takai | H01L 21/50 |
| | | | 438/27 |
| 2013/0052756 A1* | 2/2013 | Okujo | H01L 21/67248 |
| | | | 438/7 |
| 2013/0119552 A1* | 5/2013 | Lin | H01L 25/0652 |
| | | | 257/774 |
| 2014/0042152 A1* | 2/2014 | Hu | H01L 21/67109 |
| | | | 219/679 |
| 2014/0124900 A1 | 5/2014 | West et al. | |
| 2014/0145324 A1* | 5/2014 | Uchibori | H01L 23/48 |
| | | | 257/737 |
| 2015/0093858 A1* | 4/2015 | Hwang | H01L 24/96 |
| | | | 438/113 |
| 2016/0276168 A1* | 9/2016 | Huang | H01L 21/324 |

* cited by examiner

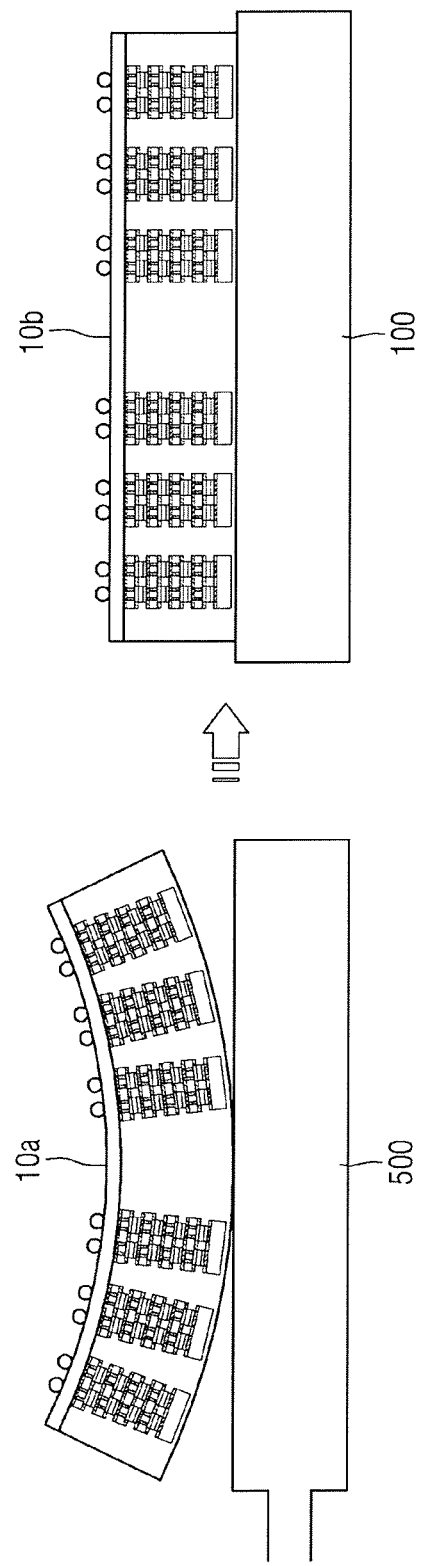

APPARATUS AND METHOD FOR REDUCING WAFER WARPAGE

CROSS-REFERENCE TO RELATED APPLICATION

This application claims priority under 35 USC § 119 to Korean Patent Application No. 10-2016-0117729 filed on Sep. 13, 2016 in the Korean Intellectual Property Office, the disclosure of which is incorporated by reference herein in its entirety.

1. TECHNICAL FIELD

Exemplary embodiments of the present inventive concept relate to an apparatus for reducing wafer warpage, and more particularly to a method for reducing wafer warpage.

2. DISCUSSION OF RELATED ART

A wafer might not be fixed to equipment during assembly and test processes and thus wafer warpage may occur after a mold process. Wafer warpage may result from a difference in respective thermal expansion coefficients of a film material, a mold material, and a stack structure bonding material of a silicon device.

SUMMARY

An exemplary embodiment of the present inventive concept provides an apparatus for reducing wafer warpage.

An exemplary embodiment of the present inventive concept provides a method for reducing wafer warpage.

A method for reducing wafer warpage according to an exemplary embodiment of the present inventive concept includes positioning a mold wafer structure on a stage. The mold wafer structure includes a mold layer and a stack structure positioned on a wafer. The stage includes a center region and an edge region adjacent the center region. Warpage information of the mold wafer structure is obtained. The mold wafer structure is heated by the stage based on the warpage information to reduce a warpage of the mold wafer structure. A temperature of the center region and a temperature of the edge region are different from each other. An operation test is performed on the stack structure.

A method for reducing wafer warpage according to an exemplary embodiment of the present inventive concept includes forming a stack structure on a wafer. A mold layer substantially surrounding the stack structure is formed on the wafer. A mold wafer structure including the wafer, the stack structure and the mold layer is positioned on a test stage. The test stage includes a first ring heater having a first radius and a second ring heater having a second radius greater than the first radius and substantially surrounding the first ring heater. Warpage of the mold wafer structure is reduced by heating the mold wafer structure through the first ring heater and the second ring heater based on warpage information of the mold wafer structure. Temperatures of the first and second ring heaters are different from each other.

BRIEF DESCRIPTION OF THE DRAWINGS

The above and other features of the present inventive concept will become more apparent by describing in detail exemplary embodiments thereof with reference to the attached drawings, in which:

FIG. 19 is a view illustrating the method for reducing wafer warpage of FIG. 18.

DETAILED DESCRIPTION

An apparatus for reducing wafer warpage according to some exemplary embodiments of the present inventive concept will be described in more detail below with reference to FIGS. 1 to 5.

Figure 1:
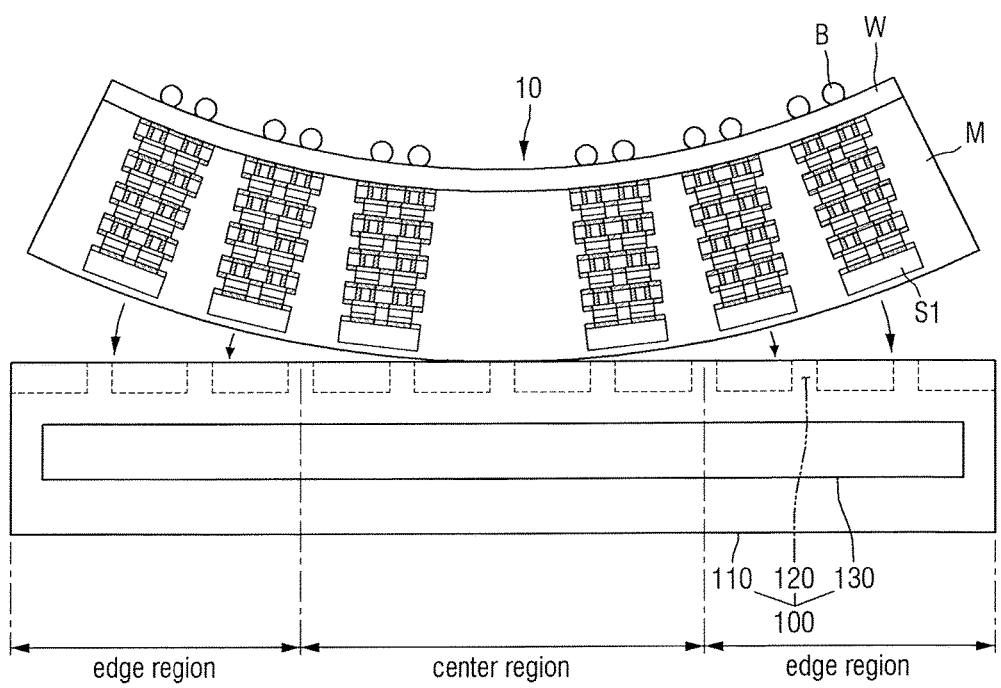
FIG. 1 is a front view illustrating an apparatus for reducing wafer warpage according to an exemplary embodiment of the present inventive concept.
Figure 2:
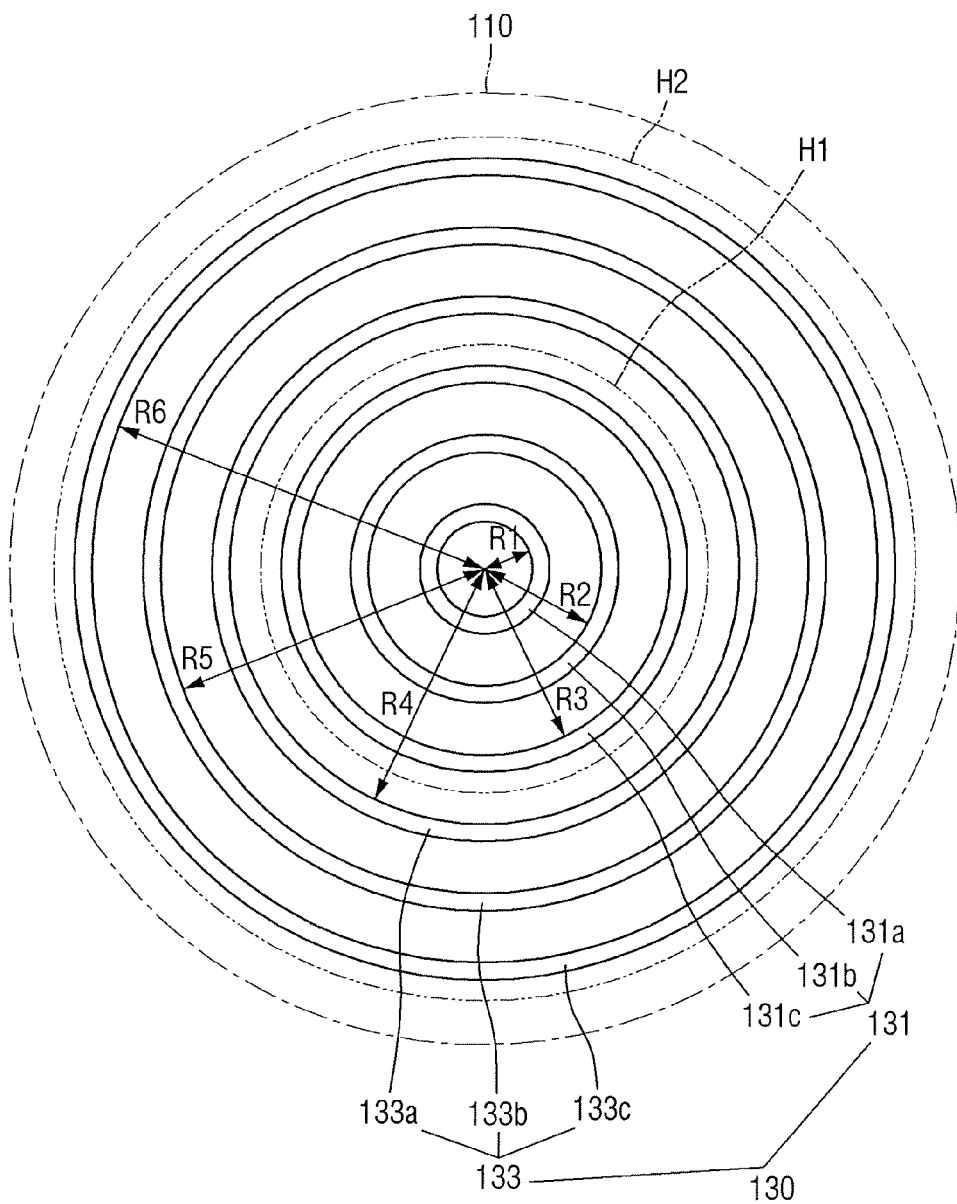
FIG. 2 is a top view illustrating the apparatus for reducing wafer warpage of FIG. 1.
Figure 3:
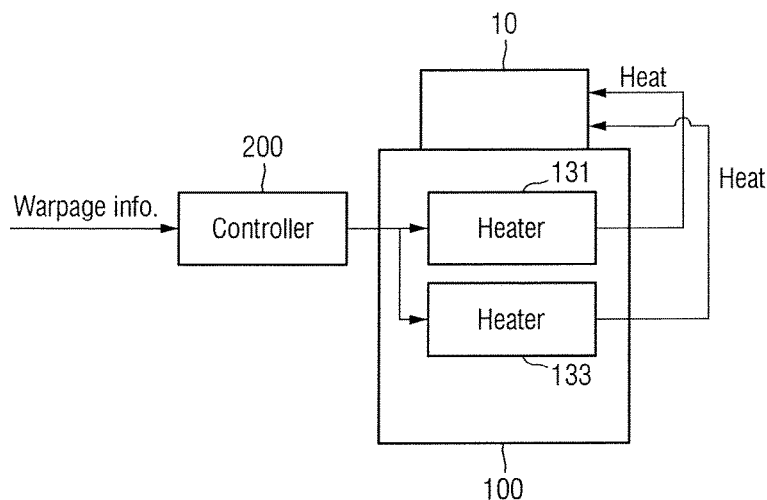
FIG. 3 is a diagram illustrating the apparatus for reducing wafer warpage of FIG. 1.
Figure 4:
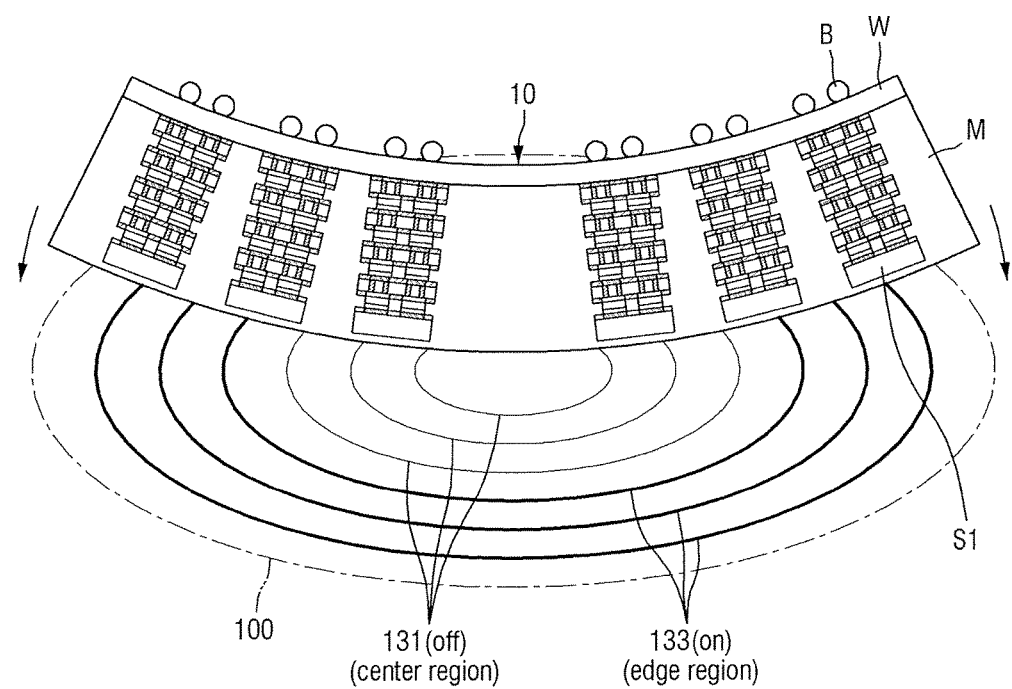
FIG. 4 is a front view illustrating operation of the apparatus for reducing wafer warpage of FIG. 1.
Figure 5:
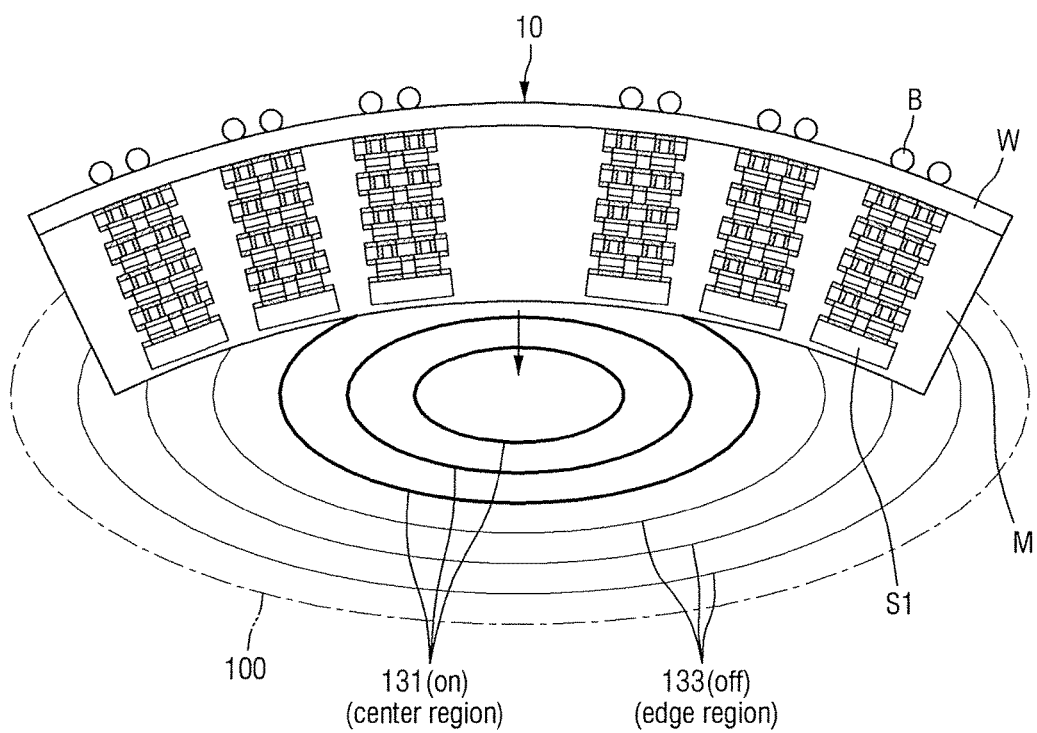
FIG. 5 is a front view illustrating operation of the apparatus for reducing wafer warpage of FIG. 1.

FIG. 1 is a front view illustrating an apparatus for reducing wafer warpage according to an exemplary embodiment of the present inventive concept. FIG. 2 is a top view illustrating the apparatus for reducing wafer warpage of FIG. 1. FIG. 3 is a diagram illustrating the apparatus for reducing wafer warpage of FIG. 1. FIG. 4 is a front view illustrating operation of the apparatus for reducing wafer warpage of FIG. 1. FIG. 5 is a front view illustrating operation of the apparatus for reducing wafer warpage of FIG. 1.

Referring to FIG. 1, an apparatus for reducing wafer warpage according to an exemplary embodiment of the present inventive concept may include a stage 100.

The stage 100 may test a mold wafer structure 10. As an example, the mold wafer structure 10 may be disposed on and/or connected to the stage 100. The mold wafer structure 10 may include a wafer W, a stack structure S1, and a bump B. The wafer W may be a semiconductor substrate. The wafer W may include at least one of silicon, germanium, and silicon germanium. However, exemplary embodiments of the present inventive concept are not limited thereto.

The stack structure S1 may be stacked on the wafer W. The stack structure S1 may be a structure in which chips are stacked and overlap each other in a plurality of layers. The stack structure S1 may include a through silicon via (TSV) structure.

A mold layer M may substantially cover upper surfaces of the stack structure S1 and the wafer W. Since the mold layer M covers the upper surfaces of the stack structure S1 and the wafer W, the stack structure S1 and the wafer W may be fixed to each other by the mold layer M. Thus, the stack structure S1 having a relatively large aspect ratio may be supported by the mold layer M.

The bump B may be connected to the stack structure S1 and may be formed on a lower surface of the wafer W. As an example, the stack structure S1 and the bump B may penetrate through the wafer W and may be electrically connected to each other. The bump B may be a connection terminal, which may connect the mold wafer structure 10 to another structure.

The mold wafer structure 10 may be mounted on the stage 100. A portion (e.g., a lower surface) of the mold wafer structure 10 opposite the upper surface of the wafer W may face in a downward direction and may be in direct contact with the stage 100. The mold wafer structure 10 may be mounted on the stage 100. The bump B may face and/or protrude in an upward direction opposite the lower surface of the wafer W, which may be in direct contact with the stage.

The stage 100 may include a stage housing 110, a suction hole 120, and a heater 130.

The stage housing 110 may be a portion of the stage 100 forming an outer shape of the stage 100. The stage housing 110 may support the mold wafer structure 10 mounted on the stage 100. The stage housing 110 may include the suction hole 120 and the heater 130 therein. The stage housing 110 may have an upper surface which is large enough to mount the mold wafer structure 10. The upper surface of the stage housing 110 may have a substantially circular shape. However, exemplary embodiments of the present inventive concept are not limited thereto.

The suction hole 120 may be formed in the upper surface of the stage housing 110. The suction hole 120 may be a structure which adsorbs an object mounted on the upper surface of the stage housing 110 to the stage 100. As an example, the suction hole 120 may fix the object formed on the upper surface of the stage 100 and mounted on the upper surface by the vacuum. As an example, the mold wafer structure 10 may be attached to the upper surface of the stage housing 110 through the suction hole 120.

The heater 130 may be positioned inside the stage housing 110. The heater 130 may heat the mold wafer structure 10 mounted on the stage 100 within the stage housing 110. The heater 130 may heat the mold wafer structure 10 from a lower portion of the mold wafer structure 10.

Referring to FIG. 2, the heater 130 may be a ring shaped heater.

The heater 130 may include a plurality of ring heaters (e.g., ring heaters 131 and ring heaters 133). For example, ring heaters 131a, 131b and 131c, and ring heaters 133a, 133b and 133c may be concentric circle shapes having substantially a same center. The ring heaters 131a-131c, 133a-133c may have different radii from each other. As an example, each of the ring heaters 131a-131c, 133a-133c may have first to sixth radii R1-R6.

As an example, a first ring heater 131a may have a first radius R1, and a second ring heater 131b may have a second radius R2. A third ring heater 131c may have a third radius R3, and a fourth ring heater 133a may have a fourth radius R4. A fifth ring heater 133b may have a fifth radius R5, and a sixth ring heater 133c may have a sixth radius R6.

The first to sixth radii R1-R6 may be different from one another. As an example, the first radius R1 may be less than the second radius R2, and the second radius R2 may be less than the third radius R3. The third radius R3 may be less than the fourth radius R4. The fourth radius R4 may be less than the fifth radius R5. The fifth radius R5 may be less than the sixth radius R6.

Although the shapes of the first to sixth ring heaters may be substantially circular, exemplary embodiments of the present inventive concept are not limited thereto. For example, shapes of the first to sixth ring heaters might not be circular.

While there may be a number of ring heaters in the apparatus for reducing wafer warpage according to some exemplary embodiments of the present inventive concept, exemplary embodiments of the present inventive concept are not limited thereto. The number of the ring heaters is not specifically limited to a particular number.

The heater 130 may include a plurality of regions. For example, the heater 130 may include a first region H1 and a second region H2. The first region H1 may be a region where the first to third ring heaters 131 are positioned. The second region H2 may be a region where the fourth to sixth ring heaters 133 are positioned.

The first to sixth ring heaters (e.g., ring heaters 131 and ring heaters 133) may apply heat to the lower surface of the mold wafer structure 10 from the lower portion of the mold wafer structure 10. As an example, the first to sixth ring heaters may substantially evenly provide heat from a center to an edge of the mold wafer structure 10.

The stage 100 including the first to sixth ring heaters may include a center region and an edge region on the upper surface. The center region may be a region corresponding to the first region H1 including the first to third ring heaters 131. For example, the first region H1 and the center region may overlap each other. The edge region may be a region corresponding to the second region H2 including the fourth to sixth ring heaters 133. As an example, the second region H2 and the edge region may overlap each other.

Referring to FIG. 3, the apparatus for reducing wafer warpage according to an exemplary embodiment of the present inventive concept may include a controller 200.

The controller 200 may receive warpage information (e.g., from a source that is external to the apparatus for reducing warpage). The warpage information may indicate warping degree of the mold wafer structure 10 (see, e.g., FIG. 1). For example, the warpage information may be information indicating which region of the mold wafer structure 10 is warped and how much the region is warped.

The controller 200 may control whether each of the first to sixth ring heaters is on or off based on the received warpage information. As an example, the controller 200 may control which ring heater(s) is/are on, and which ring heaters is/are off, based on the warpage information.

The first to third ring heaters 131 positioned in the first region H1 may be substantially simultaneously turned on or substantially simultaneously turned off. Similarly, the fourth to sixth ring heaters 133 positioned in the second region H2 may be substantially simultaneously turned on or substantially simultaneously turned off.

Operation of an apparatus for reducing wafer warpage according to an exemplary embodiment of the present inventive concept will be described in more detail below with reference to FIGS. 3 to 5.

Referring first to FIG. 4, when the mold wafer structure 10 is shaped with a relatively low center region and a relatively high edge region, the first to third ring heaters 131 of the first region H1 may be off, and the fourth to sixth ring heaters 133 of the second region H2 may be on. Thus, the warpage of the mold wafer structure 10 may be reduced or eliminated by the heat applied to the edge region. Since a height of the edge region of the mold wafer structure 10 may be lowered, the warpage with respect to the center region may be reduced or eliminated. Thus, the edge region of the mold wafer structure 10 may be substantially completely adsorbed through at least one suction hole 120 of the stage 100.

Referring to FIG. 5, when the mold wafer structure 10 is shaped with a relatively high center region and a relatively low edge region, the first to third ring heaters 131 of the first region H1 may be on, and the fourth to sixth ring heaters 133 of the second region H2 may be off. Thus, the warpage of the mold wafer warpage 10 may be reduced or eliminated by the heat applied to the center region. Since a height of the center region of the mold wafer structure 10 may be lowered, the warpage with the edge region may be reduced or eliminated. Thus, the center region of the mold wafer structure 10 may be substantially completely adsorbed through at least one suction hole 120 of the stage 100.

Referring to FIG. 3, the controller 200 may determine which ring heater(s) is/are to be on and which ring heater(s) is/are to be off, among the first to third ring heaters 131 and the fourth to sixth ring heaters 133 according to the warpage information of the mold wafer structure 10. Thus, the warpage of the mold wafer structure 10 may be reduced or eliminated.

Referring to FIGS. 3 to 5, the first to sixth ring heaters (e.g., ring heaters 131 and 133) may be turned on or off individually, as desired. Additionally, an apparatus for reducing wafer warpage according to some exemplary embodiments of the present inventive concept may individually control a temperature of each ring heater. For example, each ring heater may be controlled to be at a different temperature from each other while all the ring heaters are on.

Referring to FIG. 4, when the mold wafer structure 10 is shaped with the relatively low center region and the relatively high edge region, the first to third ring heaters 131 of the first region H1 may be on at a first temperature and the fourth to sixth ring heaters 133 of the second region H2 may be on at a second temperature. As an example, the first temperature may be lower than the second temperature. As an example, the center region may be heated at a relatively lower temperature, and the edge region may be heated at a relatively higher temperature.

As an example, the warpage of the mold wafer structure 10 may be reduced or eliminated with the relatively greater heat applied to the edge region. Thus, because a height of the edge region of the mold wafer structure 10 may be lowered, the warpage with respect to the center region may be reduced or eliminated. Thus, the edge region of the mold wafer structure 10 may be substantially completely adsorbed through at least one suction hole 120 of the stage 100.

Referring to FIG. 5, when the mold wafer structure 10 is shaped with the relatively high center region and the relatively low edge region, the first to third ring heaters 131 of the first region H1 may be on at a third temperature and the fourth to sixth ring heaters 133 of the second region H2 may be on at a fourth temperature. As an example, the third temperature may be higher than the fourth temperature. Thus, the center region may be heated at a relatively higher temperature and the edge region may be heated at a relatively lower temperature.

Thus, the warpage of the mold wafer structure 10 may be reduced or eliminated with the relatively greater heat applied to the center region than is applied to the edge region. As an example, since a height of the center region of the mold wafer structure 10 may be lowered, the warpage with respect to the edge region may be reduced or eliminated. Thus, the center region of the mold wafer structure 10 may be substantially completely adsorbed through at least one suction hole 120 of the stage 100.

An apparatus for reducing wafer warpage according to an exemplary embodiment of the present inventive concept will be described in more detail below with reference to FIG. 6. Elements or operations described with reference to FIG. 6 may be substantially the same as those described above with reference to FIGS. 1 to 5 and thus duplicative descriptions may be omitted.

Figure 6:
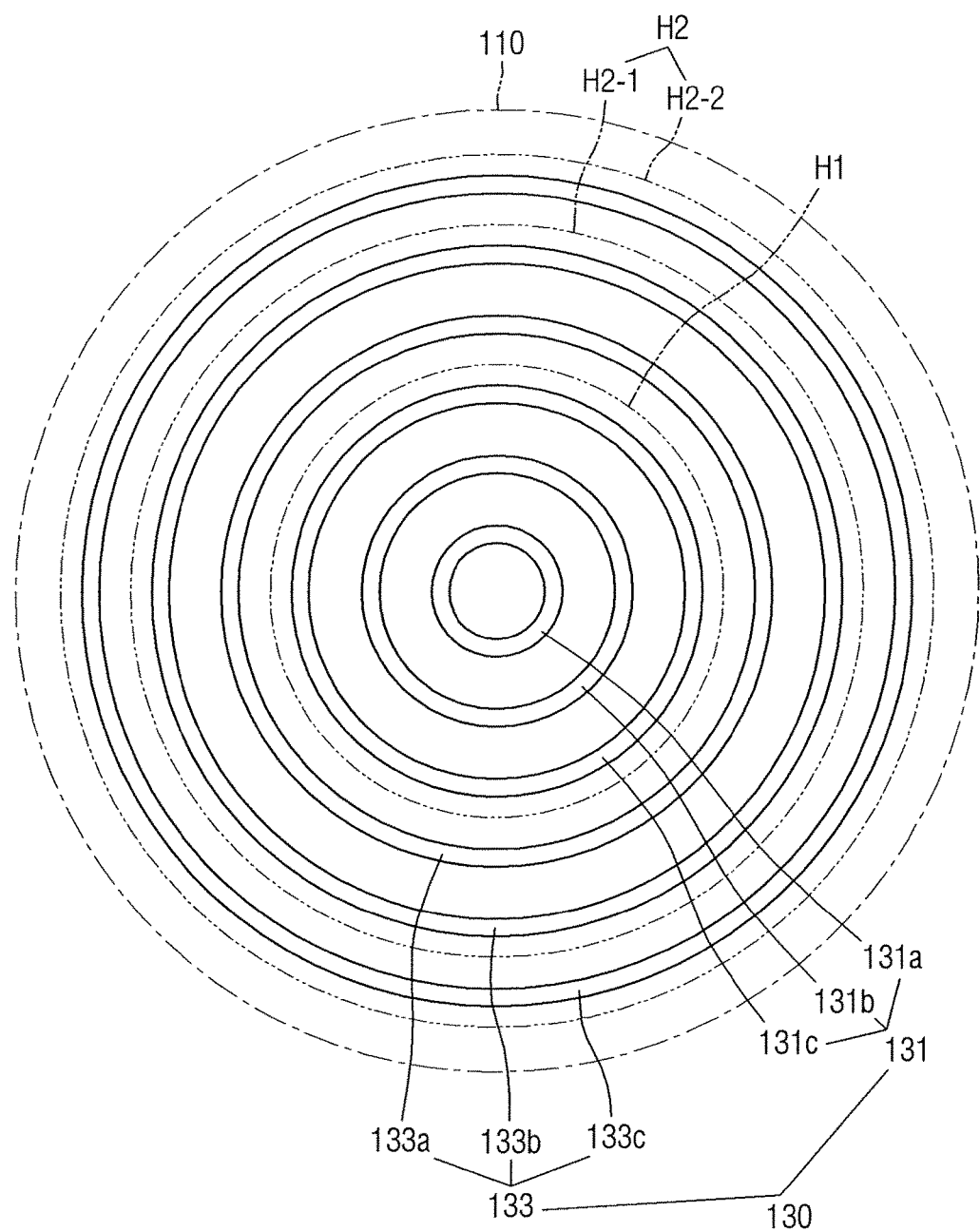
FIG. 6 is a front view illustrating an apparatus for reducing wafer warpage according to an exemplary embodiment of the present inventive concept.

FIG. 6 is a front view illustrating an apparatus for reducing wafer warpage according to an exemplary embodiment of the present inventive concept.

Referring to FIG. 6, the second region H2 may include a plurality of regions. As an example, the second region H2 may include a second-first region H2-1 and a second-second region H2-2.

The second-first region H2-1 may be positioned between the first region H1 and the second-second region H2-2. As an example, the second-first region H2-1 may be in contact with an external area of the first region H1 and may substantially surround the first region H1. An outer surface of the second-first region H2-1 may be substantially surrounded by the second-second region H2-2, and the second-first region H2-1 may be in contact with the second-second region H2-2.

The second-second region H2-2 may be positioned outside the second-first region H2-1. As an example, the second-second region H2-2 may be a region which is in contact with the second-first region H2-1, and substantially surrounds the second-first region 1-12-1. The second-second region H2-2 may be a region which substantially surrounds the first region H1 but is not in contact with the first region H1.

The second-first region H2-1 may include the fourth and fifth ring heaters 133a, 133b. The second-second region H2-2 may include the sixth ring heater 133c. However, exemplary embodiments of the present inventive concept are not limited thereto. According to an exemplary embodiment of the present inventive concept, only the fourth ring heater 133a might be included in the second-first region H2-1, and the fifth ring heater 133b and the sixth ring heater 133c might be included in the second-second region H2-2. As an example, when the apparatus for reducing wafer warpage according to some exemplary embodiments of the present inventive concept includes three or more regions, a number of the heaters within each region is not limited to a particular number of heaters.

The fourth and fifth ring heaters 133a, 133b in the second-first region H2-1 and the sixth ring heater 133c in the second-second region H2-2 may be controlled to be turned on or off by the controller 200 of FIG. 3. For example, the controller 200 (see, e.g., FIG. 3) may turn on or off the ring heaters in the first region H1, the second-first region H2-1, and the second-second region H2-2 based on warpage information (see, e.g., FIG. 3).

The controller 200 (see, e.g., FIG. 3) may control temperatures of the ring heaters in the first region H1, the second-first region H2-1, and the second-second region H2-2 based on warpage information (see, e.g., FIG. 3). When the edge region is relatively high (see, e.g., FIG. 4), the mold wafer structure 10 may be heated so that the first region H1, the second-first region H2-1, and the second-second region H2-2 have sequentially higher temperatures.

When the center region is relatively high (see, e.g., FIG. 5), the mold wafer structure 10 may be heated so that the first region H1, the second-first region H2-1 and the second-second region H2-2 have sequentially lower temperatures.

According to some exemplary embodiments of the present inventive concept the heater may have three regions; however, exemplary embodiments of the present inventive concept are not limited thereto. The apparatus for reducing wafer warpage according to some exemplary embodiments of the present inventive concept may include three or more regions, and the three or more regions may be turned on or off separately based on warpage information (see, e.g., FIG. 3) and temperatures of each of the three or more regions may be separately controlled (e.g., by the controller 200). Thus, relatively precise warpage reducing operations may be performed.

An apparatus for reducing wafer warpage according to an exemplary embodiment of the present inventive concept will be described in more detail below with reference to FIGS. 7 and 8. Elements or operations described with reference to FIGS. 7-8 may be substantially the same as those described above and thus duplicative descriptions may be omitted.

Figure 7:
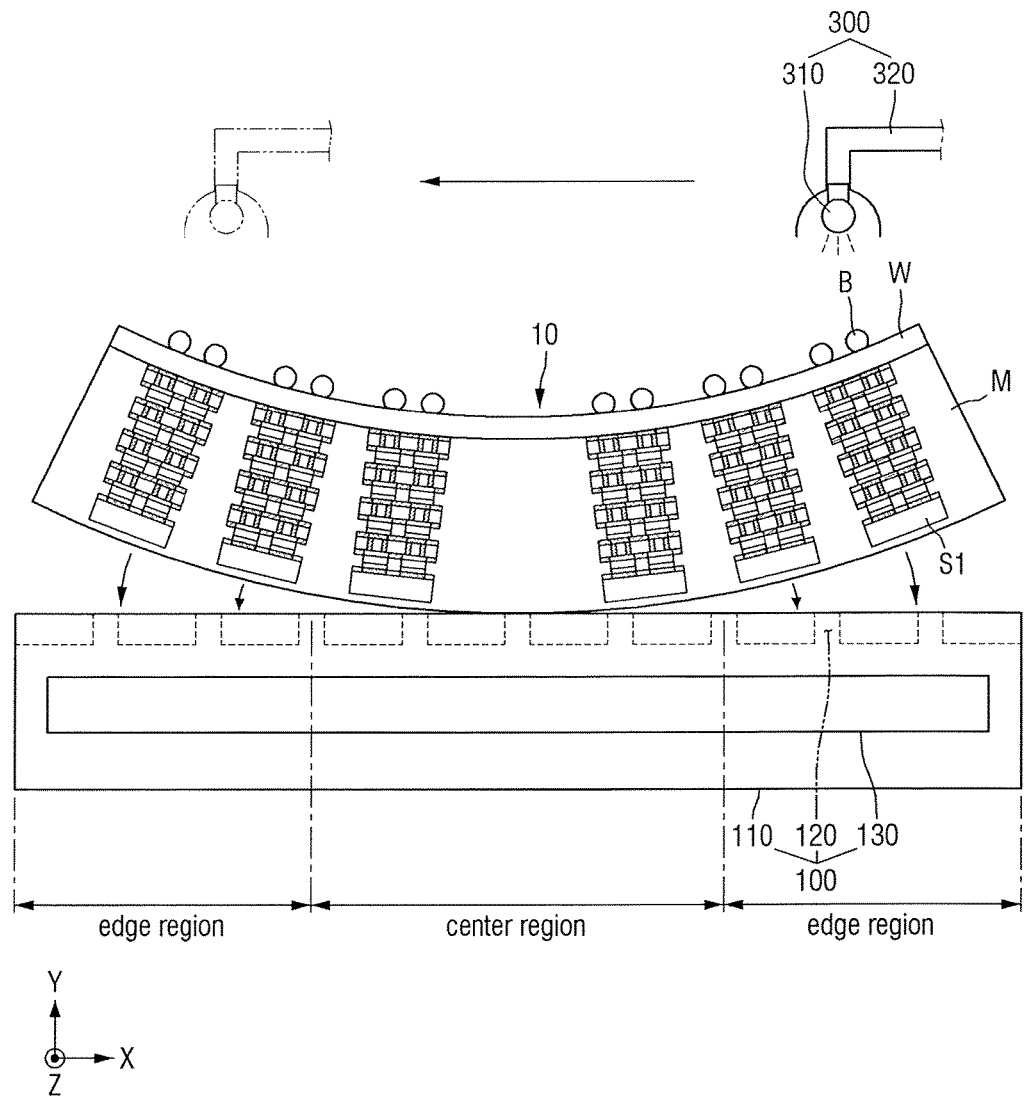
FIG. 7 is a front view illustrating an apparatus for reducing wafer warpage according to an exemplary embodiment of the present inventive concept.

FIG. 7 is a front view illustrating an apparatus for reducing wafer warpage according to an exemplary embodiment of the present inventive concept. FIG. 8 is a top view illustrating operation of the apparatus for reducing wafer warpage of FIG. 7.

Referring to FIG. 7, an apparatus for reducing wafer warpage according to an exemplary embodiment of the present inventive concept may include a heating lamp 300.

The heating lamp 300 may be positioned on or above the stage 100. The heating lamp 300 may be positioned above the mold wafer structure 10 mounted on the stage 100. A portion of the mold layer M of the mold wafer structure 10 may be in direct contact with the upper surface of the stage 100, and the bump B may be exposed in an upward direction opposite the upper surface of the stage 100. The bump B may include a plurality of bumps.

The heating lamp 300 may apply heat to the portion of the mold layer M including the bump B of the mold wafer structure 10. The heating lamp 300 may reduce wafer warpage by applying heat to a relatively narrow region in a spotlight form.

The heating lamp 300 may include a heating source 310 and a lamp arm 320.

The heating source 310 may be a lamp portion which directly applies heat to the mold wafer structure 10. The heating source 310 may be, for example, a halogen lamp. However, exemplary embodiments are not limited thereto. The heating source 310 need not be limited to a specific type of heating source. The heating source 310 may be connected with the lamp arm 320.

The lamp arm 320 may be connecting to the heating source 310 and may suspend the heating source 310 above the mold wafer structure 10. The lamp arm 320 may move in an XY plane above the mold wafer structure 10. The lamp arm 320 may move also in Z axis, which may control a heating intensity of the heating source 310 with respect to the mold wafer structure 10. Thus, according to the Z axis movement of the lamp arm 320, the heating intensity applied to the mold wafer structure 10 may be controlled.

The heating lamp 300 may reduce wafer warpage without individually heating each region of the stage 100. That is, the heating lamp 300 may further reduce horizontally asymmetrical warpage of the mold wafer structure 10. Thus, by using the heating lamp 300 in addition to the ring shaped heater, effects of reducing wafer warpage may be further increased.

Figure 8:
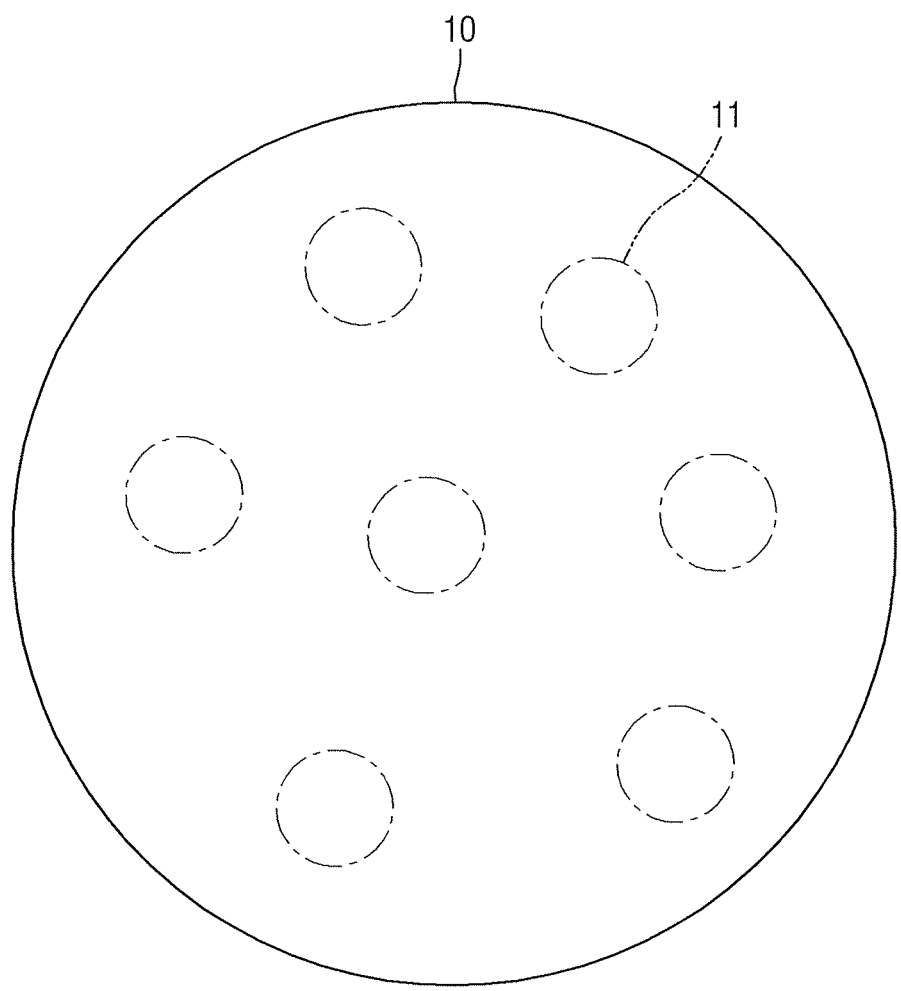
FIG. 8 is a top view illustrating operation of the apparatus for reducing wafer warpage of FIG. 7.

Referring to FIG. 8, the heating lamp 300 may apply the heat to a spotlight form of a heating region 11 on the upper surface of the mold wafer structure 10. The heating region 11 may be positioned anywhere by the lamp arm 320 as long as it is the upper surface of the mold wafer structure 10. Although the heating region 11 is illustrated to be in circular shape, exemplary embodiments of the present inventive concept are not limited thereto. Further, according to a distance with the heating lamp 300 and a size of the heating source 310, a size of the heating region 11 may be varied.

An apparatus for reducing wafer warpage according to an exemplary embodiment of the present inventive concept will be described in more detail below with reference to FIG. 9. Elements or operations described with reference to FIG. 9 may be substantially the same as those described above and thus duplicative descriptions may be omitted.

Figure 9:
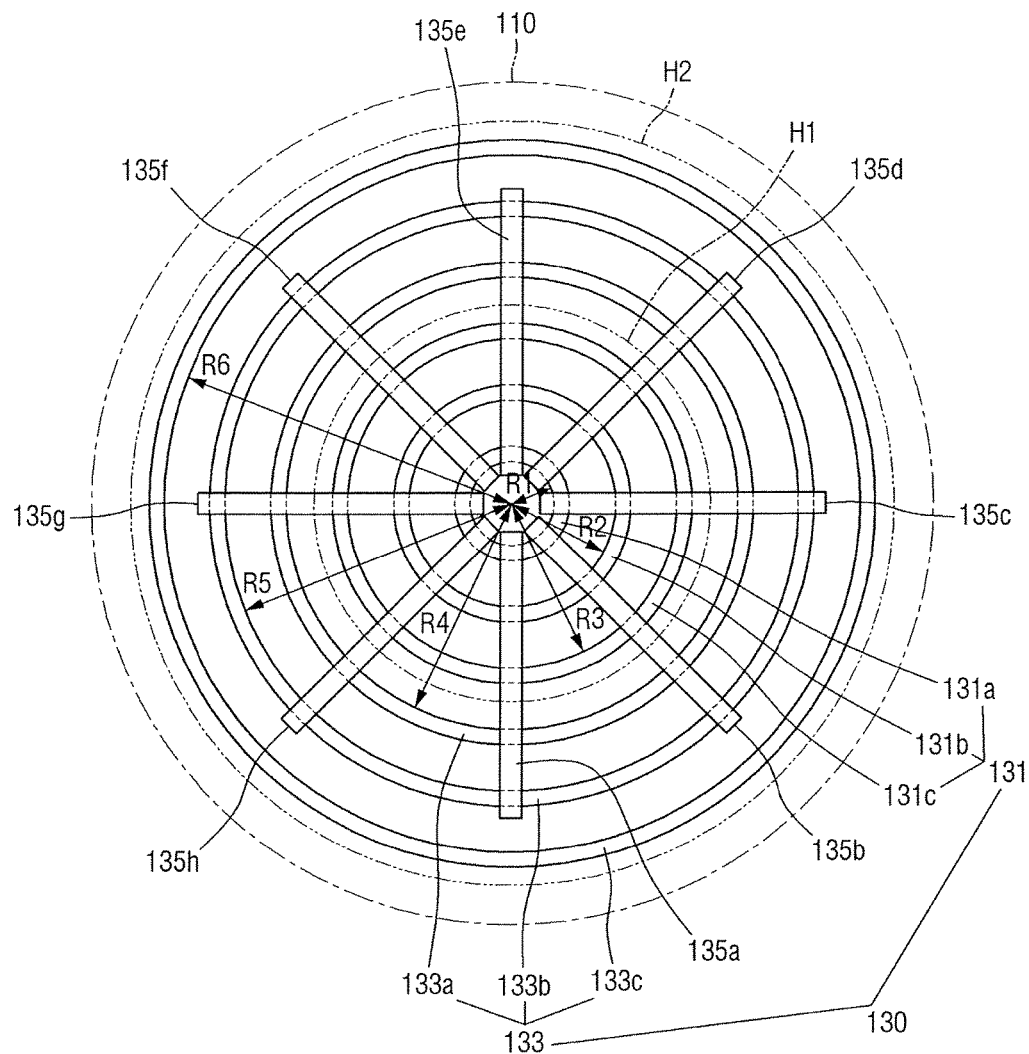
FIG. 9 is a front view illustrating an apparatus for reducing wafer warpage according to an exemplary embodiment of the present inventive concept.

FIG. 9 is a front view illustrating an apparatus for reducing wafer warpage according to an exemplary embodiment of the present inventive concept.

Referring to FIG. 9, an apparatus for reducing wafer warpage according to an exemplary embodiment of the present inventive concept may include bar heaters 135a-135h.

The bar heaters 135a-135h may be positioned within the stage 100. As an example, the bar heaters 135a-135h may be positioned within the stage housing 110. The bar heaters 135a-135h may overlap with the first to sixth ring heaters (see, e.g., ring heaters 131 and 133 described above in more detail). The bar heaters 135a-135h may each be bar shaped heaters (e.g., straight bar shaped heaters). The bar heaters 135a-135h may reduce horizontally asymmetrical warpage.

A plurality of bar heaters 135a-135h may be provided. As an example, the bar heaters may include a first bar heater 135a, a second bar heater 135b, a third bar heater 135c, a fourth bar heater 135d, a fifth bar heater 135e, a sixth bar heater 135f, a seventh bar heater 135g and an eighth bar heater 135h; however, exemplary embodiments of the present inventive concept is not limited thereto. The bar heaters 135a-135h may be positioned in a substantially horizontally symmetrical arrangement. The bar heaters 135a-135h may be disposed on the first to sixth ring heaters; however, exemplary embodiments of the present inventive concept is not limited thereto. For example, the bar heaters 135a-135h may be positioned under the first to sixth ring heaters (see, e.g., ring heaters 131 and 133 described above in more detail).

The bar heaters 135a-135h may be controlled to be turned on or off by the controller 200 (see, e.g., FIG. 3). As an example, the bar heaters 135a-135h may each individually be turned on or off according to a degree of warpage of corresponding portions. For example, when portions corresponding to the first to third bar heaters 135a-135c and the seventh bar heater 135h of the mold wafer structure 10 are relatively higher than the other portions, the controller 200 may turn on the first to third bar heaters 135a-135c and the seventh bar heater 135g, and turn off the fourth to sixth bar heaters 135d-135f and the eighth bar heater 135h.

As an example, warpage may be reduced or eliminated by turning on all the bar heaters 135a-135h. The temperatures of each of the bar heaters 135a-135h may be individually controlled to be different from each other. As an example, when the portions corresponding to the first to third bar heaters 135a-135c and the seventh bar heater 135g of the mold wafer structure 10 are relatively higher than the other portions, the controller 200 may turn on the first to third bar heaters 135a-135c and the seventh bar heater 135g at a first temperature, and turn on the other fourth to sixth bar heaters 135d-135f and the eighth bar heater 135h at a second temperature, which may be different from the first temperature. For example, the first temperature may be higher than the second temperature.

Thus, the apparatus for reducing wafer warpage according to some exemplary embodiments of the present inventive concept may reduce horizontally asymmetrical warpage and may reduce warpage according to a radius of the heaters according to an exemplary embodiment of the present inventive concept.

An apparatus for reducing wafer warpage according to an exemplary embodiment of the present inventive concept will be described in more detail below with reference to FIGS. 10 and 11. Elements or operations described with reference to FIGS. 10 and 11 may be substantially the same as those described above and thus duplicative descriptions may be omitted.

Figure 10:
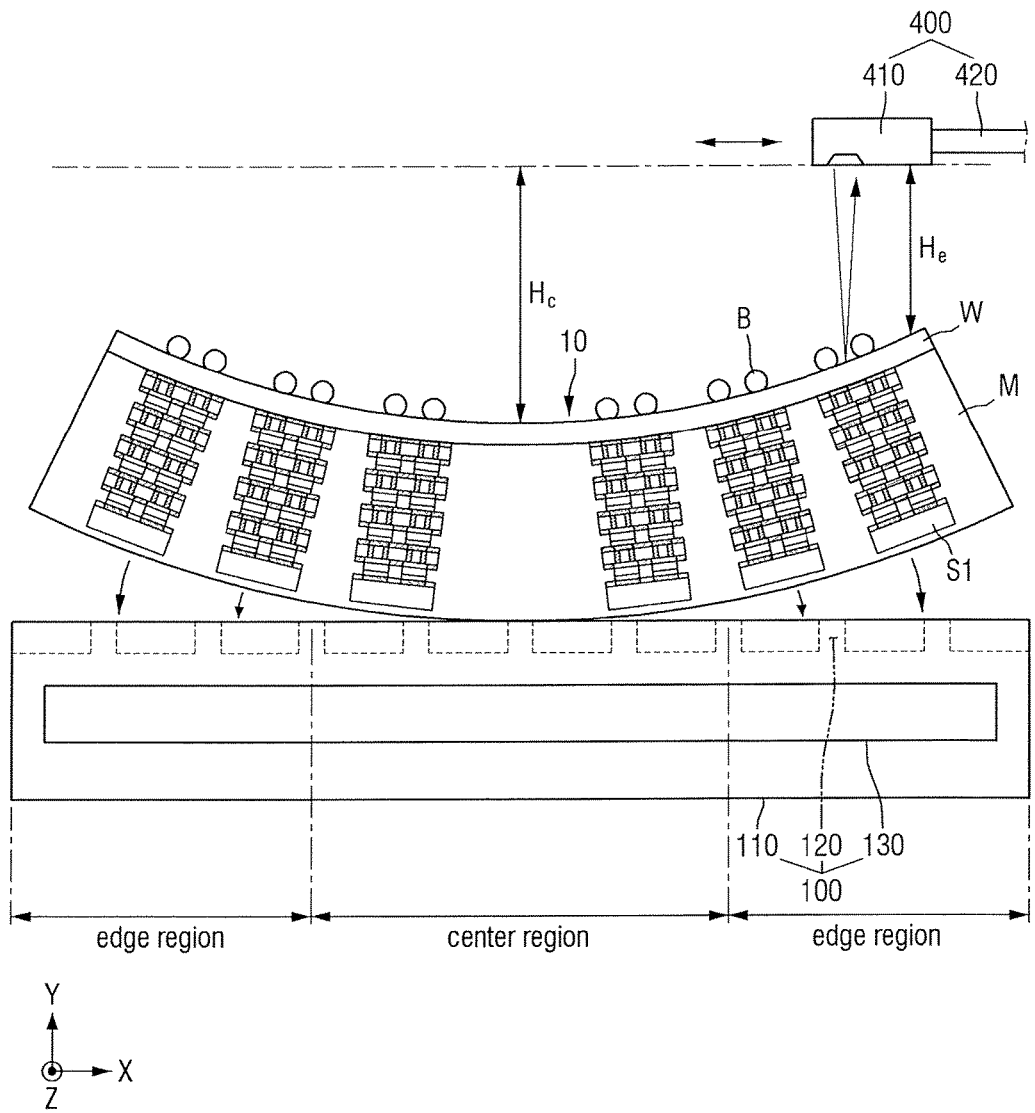
FIG. 10 is a front view illustrating an apparatus for reducing wafer warpage according to an exemplary embodiment of the present inventive concept.

FIG. 10 is a front view illustrating an apparatus for reducing wafer warpage according to an exemplary embodiment of the present inventive concept. FIG. 11 is a diagram illustrating the apparatus for reducing wafer warpage of FIG. 10.

Figure 11:
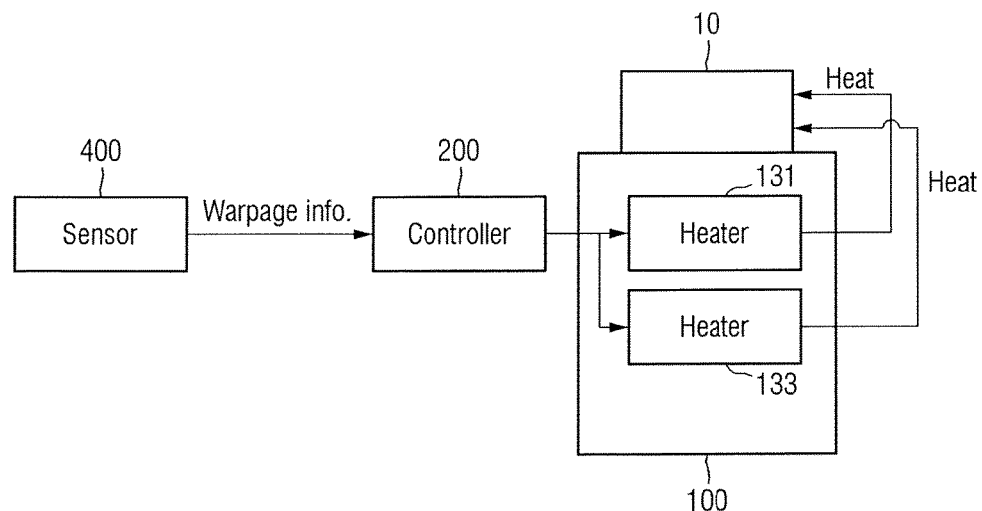
FIG. 11 is a diagram illustrating the apparatus for reducing wafer warpage of FIG. 10.

Referring to FIGS. 10 and 11, an apparatus for reducing wafer warpage according to an exemplary embodiment of the present inventive concept may include a sensor module 400.

The sensor module 400 may be positioned above the stage 100. The sensor module 400 may be positioned above the mold wafer structure 10 mounted on the stage 100. A bottom surface of the mold layer M of the mold wafer structure 10 may be in direct contact with the upper surface of the stage 100, and the bump B may be exposed in an upward direction opposite the bottom surface of the mold layer M.

The sensor module 400 may measure a displacement of a portion of the mold wafer structure 10 where the bump B (e.g., the bump B may include a plurality of bumps) is positioned. Thus, the sensor module 400 may generate warpage information of the mold wafer structure 10.

The sensor module 400 may include a displacement sensor 410 and a sensor arm 420.

The displacement sensor 410 may measure a displacement of a surface (e.g., an upper surface) of the mold wafer structure 10. For example, the displacement sensor 410 may measure a displacement Hc of a center region and a displacement He of an edge region of the mold wafer structure 10. Thus, warpage information of the mold wafer structure 10 may be obtained. As an example, the displacement sensor 410 may generate whole warpage information by measuring a displacement of the mold wafer structure 10 on an XY plane and/or on a Z plane. The displacement sensor 410 may be fixed to the sensor arm 420.

The sensor arm 420 may move in the XY plane above the mold wafer structure 10. Further, the sensor arm 420 may move also in the Z plane.

Referring to FIG. 11, the sensor module 400 may deliver the warpage information to the controller 200. The controller 200 may individually control each of the heaters 131, 133 based on the warpage information.

As an example, the apparatus for reducing wafer warpage according to an exemplary embodiment of the present inventive concept may directly generate warpage information through the sensor module 400, and may control the heaters 131, 133 by using the warpage information.

A method for reducing wafer warpage according to an exemplary embodiment of the present inventive concept will be described in more detail below with reference to FIGS. 1 to 5 and 12 to 16. Elements or operations described with reference to FIGS. 1 to 5 and 12 to 16 may be substantially the same as those described above and thus duplicative descriptions may be omitted.

Figure 12:
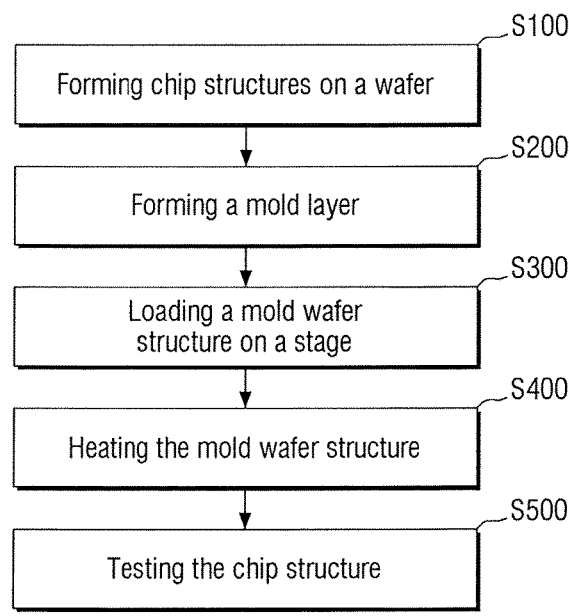
FIG. 12 is a flowchart illustrating a method for reducing wafer warpage according to an exemplary embodiment of the present inventive concept.

FIG. 12 is a flowchart illustrating a method for reducing wafer warpage according to an exemplary embodiment of the present inventive concept. FIGS. 13 to 16 are views illustrating a method for reducing wafer warpage according to an exemplary embodiment of the present inventive concept.

Referring to FIG. 12, a chip structure may be formed on the wafer W (S100). The chip structure may be a stacked structure. The chip structure may include a plurality of chip structures, which may each be stacked structures.

Figure 13:
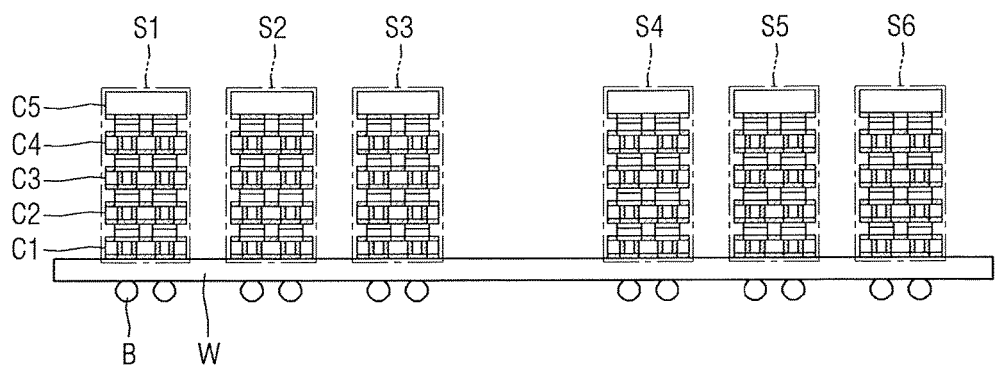
FIGS. 13 to 16 are views illustrating a method for reducing wafer warpage according to an exemplary embodiment of the present inventive concept.

As an example, referring to FIG. 13, first to sixth stack structures S1, S2, S3, S4, S5 and S6 may be formed on the wafer W; however, exemplary embodiments of the present inventive concept are not limited to a particular number of chip structures or a particular number of stack structures.

The stack structure S1 may be a structure in which a plurality of chips. As an example, chips C1, C2, C3, C5 and C5 may be stacked. However, exemplary embodiments of the present inventive concept are not limited to a particular number of chips. The stack structure S1 may include a plurality of chips C1-C5 and a bonding material formed between each of adjacent chips of the plurality of chips C1-05.

The stack structure S1 may be formed on the upper surface of the wafer W, and the bump B may be formed on the lower surface of the wafer W. The bump B may be electrically connected with each of the stack structures.

Referring again to FIG. 12, the mold layer M may be formed (S200).

Figure 14:
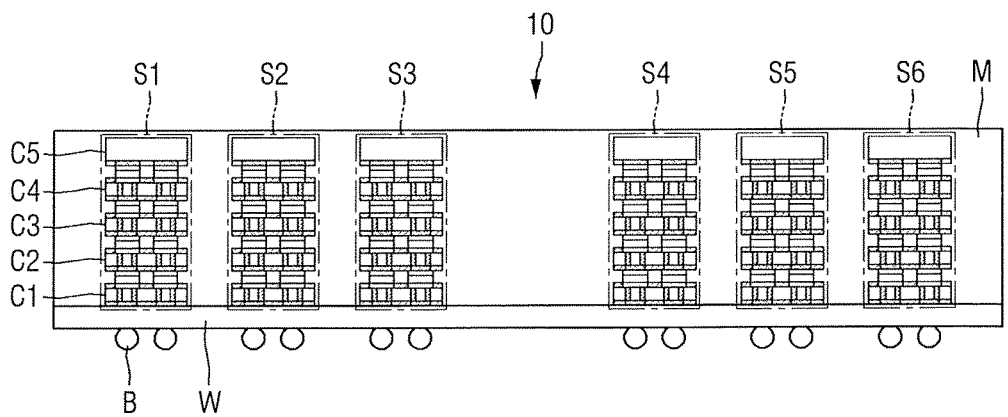

As an example, referring to FIG. 14, the mold layer M may substantially surround the stack structure S1 and may be formed on the wafer W. The mold layer M may be polymer such as an epoxy. However, exemplary embodiments of the present inventive concept are not limited thereto.

As the mold layer M is formed, the mold wafer structure 10 including the wafer W and the mold layer M may be formed.

Figure 15:
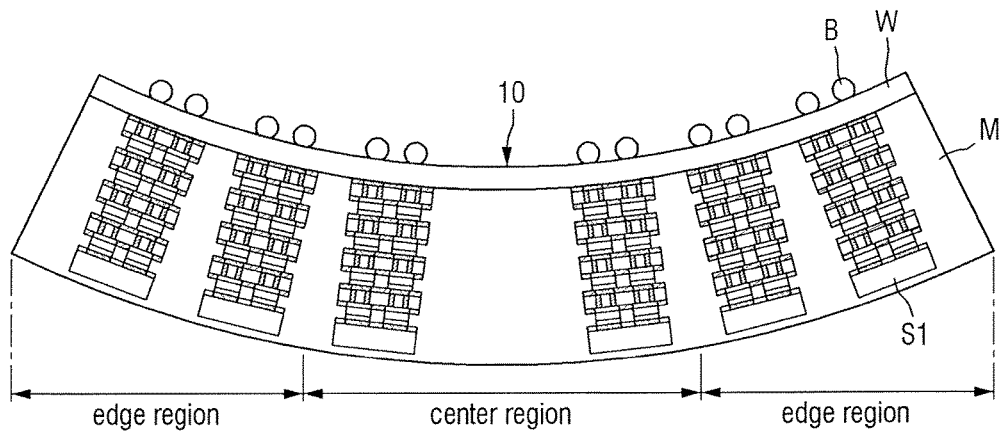
Figure 16:
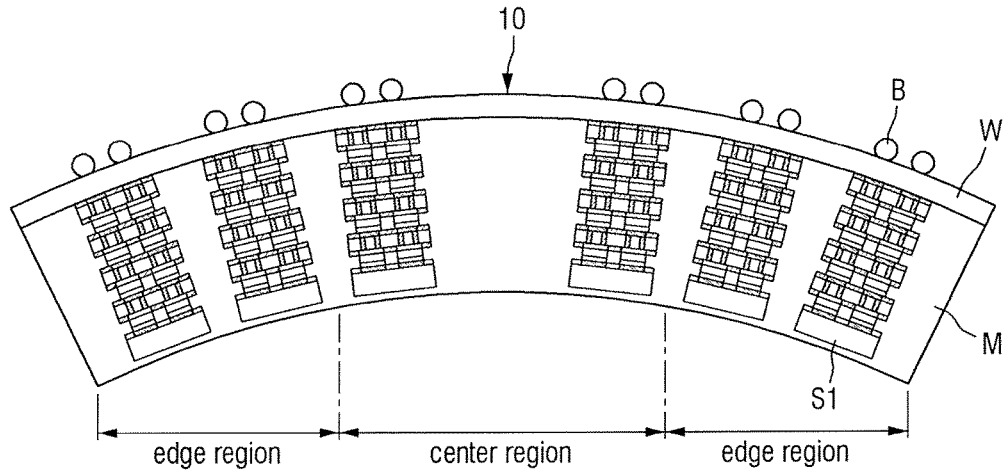

Referring to FIGS. 15 and 16, for example, warpage of the wafer W may occur as the mold layer M is formed.

Referring to FIG. 15, warpage may occur along a length of the wafer W due to a difference in thermal expansion coefficients of the wafer W, the bonding material and the mold layer M. When the bump B faces upward and a bottom surface of the mold layer M faces downward, a center region of the mold wafer structure 10 may be relatively low and an edge region may be relatively high; however, exemplary embodiments of the present inventive concept are not limited thereto.

Referring to FIG. 16, warpage may occur along a length of the mold layer M due to a difference in thermal expansion coefficients of the wafer W, the bonding material and the mold layer M. When the bump B faces upward and a bottom surface of the mold layer M faces downward, a center region of the mold wafer structure 10 may be relatively high and an edge region may be relatively low; however, exemplary embodiments of the present inventive concept are not limited thereto.

Referring again to FIG. 12, the mold wafer structure 10 may be loaded on the stage 100 (S300). For example, the mold wafer structure 10 may be attached to the stage 100.

As an example, referring to FIGS. 1 and 2, the stage 100 may fix the mold wafer structure 10 through at least one suction hole 120.

Referring to FIG. 12 again, the mold wafer structure 10 may be heated (S400).

As an example, referring to FIGS. 3 to 5, a portion to be heated may be different according to the warpage information. Thus, the warpage of the mold wafer structure 10 may be reduced or eliminated.

Referring again to FIG. 12, the chip structure may be tested (S500). For example, the stack structure S1 may be tested.

When warpage occurs, as described herein, the chip structure might not be in a position for testing. Thus, warpage may be reduced or eliminated in the mold wafer structure (e.g., the mold wafer structure 10) as described herein, and the chip structure (e.g., the stack structure S1) may be tested. Thus, warpage of the mold wafer structure may be reduced or eliminated, chip structures may be tested, and fabrication of a semiconductor device can be efficiently performed.

A method for reducing wafer warpage according to an exemplary embodiment of the present inventive concept will be described in more detail below with reference to FIGS. 12 and 17. Elements or operations described with reference to FIGS. 12 and 17 may be substantially the same as those described above and thus duplicative descriptions may be omitted.

Figure 17:
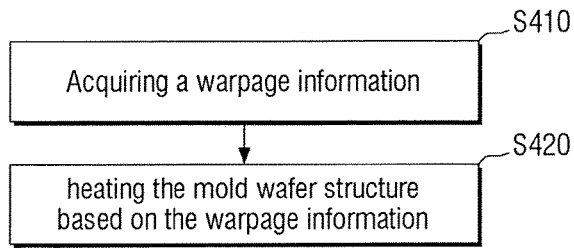
FIG. 17 is a flowchart illustrating a method for reducing wafer warpage according to an exemplary embodiment of the present inventive concept.

FIG. 17 is a flowchart illustrating a method for reducing wafer warpage according to an exemplary embodiment of the present inventive concept.

Referring to FIG. 12, the chip structures may be formed on the wafer (S100), the mold layer may be formed (S200), the mold wafer structure may be loaded on the stage (S300), and the mold wafer structure may be heated (S400). The chip structure (e.g., the stack structure S1) may be tested thereafter.

Referring to FIG. 17, heating the mold wafer structure 10 (e.g., step S400) may include following processes.

First, warpage information may be acquired (S410).

The acquired warpage information may be previously measured information. Alternatively, the warpage information may be newly measured and acquired with the method for reducing wafer warpage according to an exemplary embodiment of the present inventive concept.

The mold wafer structure may be heated based on the warpage information (S420). For example, the mold wafer structure 10 may be heated based on the warpage information.

The on or off state of the heaters according to an exemplary embodiment of the present invention, and temperatures thereof may be individually controlled according to the warpage information. Thus, relatively fine control of the heaters may be performed based on the warpage information.

Referring again to FIG. 12, the stack structure (e.g., S1) may be tested (S500).

A method for reducing wafer warpage according to an exemplary embodiment of the present inventive concept will be described in more detail below with reference to FIGS. 18 and 19. Elements or operations described with reference to FIGS. 18 and 19 may be substantially the same as those described above and thus duplicative descriptions may be omitted.

Figure 18:
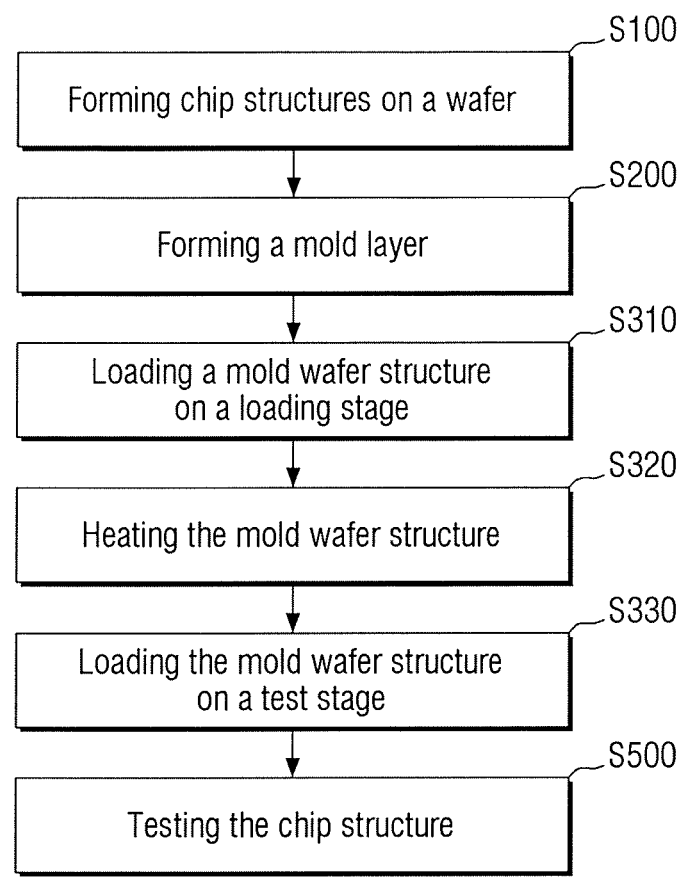
FIG. 18 is a flowchart illustrating a method for reducing wafer warpage according to an exemplary embodiment of the present inventive concept.

FIG. 18 is a flowchart illustrating a method for reducing wafer warpage according to an exemplary embodiment of the present inventive concept. FIG. 19 is a view illustrating the method for reducing wafer warpage of FIG. 18.

Referring to FIG. 18, the chip structures may be formed on the wafer (S100), and the mold layer may be formed (S200).

The mold wafer structure may be loaded on a loading stage (S310). For example, the mold wafer structure may be attached to the loading state.

As an example, referring to FIG. 19, a loading stage 500 may be a stage for transferring a mold wafer structure 10a.

Referring to FIG. 18, the mold wafer structure may be heated (S320).

As an example, the mold wafer structure 10a may be heated on the loading stage 500. Thus, the warpage of the mold wafer structure 10a may be reduced or eliminated.

The mold wafer structure may be loaded on a test stage (S330). As an example, the mold wafer structure may be attached to the test stage.

As an example, referring to FIG. 19, the test stage 100 illustrated in FIG. 19 may be the same as the stage 100 described above. A mold wafer structure 10b may be previously heated on the loading stage 500, and the warpage may be of the mold wafer structure 10b may be eliminated. Thus, a test of a stack structure (e.g., S1) may be substantially immediately performed on the test stage 100.

The method for reducing wafer warpage according to an exemplary embodiment of the present inventive concept may include substantially immediately performing a chip structure (e.g., stack structure S1) test without an additional warpage reducing process on the test stage 100 because the warpage may be reduced or eliminated during the time of transferring the mold wafer structure (e.g., 10a). Thus, process efficiency can be increased and costs can be reduced or eliminated.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A method for reducing wafer warpage, comprising:
positioning a wafer structure on a stage, wherein the wafer structure comprises a wafer, a stack structure positioned on the wafer and a polymer layer on the stack structure, wherein the stage comprises a center region and an edge region adjacent the center region, and wherein at least a portion of the polymer layer is in direct contact with the stage;
obtaining warpage information of the wafer structure;
heating the wafer structure by the stage based on the warpage information to reduce a warpage of the wafer structure, wherein a temperature of the center region and a temperature of the edge region are different from each other; and
performing a test on the stack structure to determine if the stack structure is operational.

2. The method of claim 1, wherein the edge region comprises a first edge region and a second edge region, and wherein the first and second edge regions are heated at different temperature from each other.

3. The method of claim 2, wherein a temperature of the first edge region is between a temperature of the center region and a temperature of the second edge region.

4. The method of claim 2, wherein the wafer structure comprises a first region in a position corresponding to the center region and second regions in positions corresponding to each of the first and second edge regions, and wherein the heating the wafer structure comprises:
applying a higher heat to one of the first region or the second regions of the wafer structure having a greater distance from the stage than the other of the first region or the second regions of the wafer structure and applying a lower heat to the other of the first region or the second regions of the wafer structure having a lesser distance from the stage.

5. The method of claim 1, wherein the heating the wafer structure comprises adding, with a heating lamp, heat to the wafer structure based on the warpage information.

6. The method of claim 5, wherein the heating lamp is movable above the wafer structure.

7. The method of claim 1, wherein performing the test on the stack structure comprises:
transferring the wafer structure to a second stage from the stage; and
performing the test on the wafer structure on the second stage.

8. The method of claim 1, wherein the stage comprises a first heater for heating the center region and a second heater for heating the edge region, and
the first and second heaters each have circular shapes having substantially a same center as each other and different radii from each other.

9. The method of claim 8, wherein the stage comprises a third heater extending in a direction intersecting the first and second heaters.

10. The method of claim 9, wherein the third heater includes a plurality of third heaters, and wherein each of the third heaters extends from the center region to the edge region.

11. The method of claim 1, wherein the obtaining the warpage information comprises measuring a displacement of an upper surface of the wafer structure.

12. A method for reducing wafer warpage, comprising:
forming a stack structure on a wafer;
forming a polymer layer substantially surrounding the stack structure on the wafer;
positioning a wafer structure comprising the wafer, the stack structure and the polymer layer on a first stage, wherein the polymer layer is in direct contact with the first stage, wherein the first stage comprises a first ring heater having a first radius and a second ring heater having a second radius greater than the first radius and substantially surrounding the first ring heater; and
reducing warpage of the wafer structure by heating the wafer structure through the first ring heater and the second ring heater based on warpage information of the wafer structure, wherein temperatures of the first and second ring heaters are different from each other.

13. The method of claim 12, wherein the first and second ring heaters each have substantially circular shapes having substantially a same center.

14. The method of claim 12, wherein the first stage comprises a third ring heater having a third radius greater than the second radius and substantially surrounding the second ring heater, and
the heating the wafer structure comprises heating different regions of the wafer structure, with the first to third ring heaters, at different temperatures from each other.

15. The method of claim 12, wherein the heating the wafer structure comprises turning off one of the first and second ring heaters and turning on the other of the first and second ring heaters.

16. A method of reducing wafer warpage, comprising:
positioning a wafer structure comprising a stacked structure on a first stage comprising at least one heater, wherein the wafer structure comprises a center region and edge regions adjacent to the center region, wherein the wafer structure is positioned in direct contact with the first stage;
obtaining warpage information of the wafer structure;
applying heat from the at least one heater of the first stage to at least one of the center region or the edge region of the wafer structure positioned on the first stage to reduce a warpage of the wafer structure based on the warpage information;
transferring the wafer structure having reduced warpage to a second stage; and
performing a test on the stack structure to determine if the stack structure is operational.

17. The method of reducing wafer warpage of claim 16, wherein a greater amount of heat is applied to one of the edge regions or the center region having a greater degree of warpage than the other of the edge regions or the center region and a lesser amount of heat is applied to the other of the edge regions or the center region having a lesser degree of warpage.

18. The method of reducing wafer warpage of claim 16, wherein heat is applied from above the wafer structure to reduce horizontally asymmetrical warpage of the wafer structure.

19. The method of reducing wafer warpage of claim 16, wherein the wafer structure transferred to the second stage has a substantially flat bottom surface after reducing wafer warpage on the first stage, and wherein the operation test on the stacked structure is performed substantially immediately upon transfer of the wafer structure to the second stage.

20. The method of claim 4, wherein heat is directly transmitted from the stage to a portion of the polymer layer substantially surrounding the stack structure.

* * * * *